United States Patent
Kukino et al.

(10) Patent No.: US 6,620,491 B2
(45) Date of Patent: Sep. 16, 2003

(54) TOOL OF A SURFACE-COATED BORON NITRIDE SINTERED COMPACT

(75) Inventors: Satoru Kukino, Itami (JP); Michiko Ota, Itami (JP); Hisanori Ohara, Itami (JP); Haruyo Fukui, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 24 days.

(21) Appl. No.: 09/940,338

(22) Filed: Aug. 27, 2001

(65) Prior Publication Data

US 2002/0048696 A1 Apr. 25, 2002

(30) Foreign Application Priority Data

Aug. 31, 2000 (JP) ........................ 2000-262399
Aug. 17, 2001 (JP) ........................ 2001-247814

(51) Int. Cl.[7] ................................ B32B 9/00
(52) U.S. Cl. ................ 428/209; 51/307; 51/309; 428/195; 428/216; 428/336; 428/697; 428/698; 428/699; 428/701
(58) Field of Search ............... 428/195, 209, 428/336, 698, 325, 216, 469, 472; 51/307, 309

(56) References Cited

U.S. PATENT DOCUMENTS

| 4,334,928 A | * | 6/1982 | Hara et al. |
| 5,700,551 A | * | 12/1997 | Kukino et al. |
| 5,709,907 A | | 1/1998 | Battaglia et al. |
| 5,853,873 A | * | 12/1998 | Kukino et al. |
| 6,001,758 A | * | 12/1999 | Fukaya et al. |
| 2001/0003569 A1 | | 6/2001 | Ota et al. |

FOREIGN PATENT DOCUMENTS

| EP | 0695731 | * | 2/1996 |
| EP | 1195452 | | 4/2002 |
| JP | 1096083 | | 4/1989 |
| JP | 1096084 | | 4/1989 |
| JP | 7018415 | | 1/1995 |
| JP | 8119774 | | 5/1996 |
| JP | 08323506 | * | 8/1996 |

* cited by examiner

Primary Examiner—Archene Turner
(74) Attorney, Agent, or Firm—W. F. Fasse; W. G. Fasse (57) ABSTRACT

In a surface-coated boron nitride sintered compact tool, at least a part of the tool edge related with cutting is based on a substrate of a high pressure phase type boron nitride, and a surface-coated layer is provided on the surface thereof. The surface-coated layer includes an intermediate layer present in a discontinuous manner or in the form of dispersed particles at the interface of the high pressure phase boron nitride sintered compact substrate, and further includes a hard coated layer formed thereon. The intermediate layer consists of at least one element selected from the Groups 4a, 5a and 6a of the Periodic Table, and has a thickness of at most 1 $\mu$m, or has a proportion of 1 to 20 vol % of particles with a particle diameter of 0.1 to less than 0.5 $\mu$m and at most 5 vol. % of particles with a particle diameter of at least 0.5 $\mu$m. Thereby, a markedly improved adhesive strength of the hard coated layer on the substrate is achieved.

32 Claims, 4 Drawing Sheets

DISCONTINUOUS

GRANULAR DISCONTINUITY

TOOL OF A SURFACE-COATED BORON NITRIDE SINTERED COMPACT

CROSS-REFERENCE TO RELATED APPLICATION

This application is related to copending U.S. patent application Ser. No. 09/943,840, filed on Aug. 27, 2001.

BACKGROUND OF THE INVENTION

1. Field of the Invention

This invention relates to an improvement relating to a cutting tool material using, as a substrate, a sintered compact comprising a high pressure phase boron nitride such as cubic boron nitride (cBN), wurtzite boron nitride (wBN), etc. which will hereinafter be referred to as "cBN sintered compact", and in particular, it is concerned with a cutting tool of a surface-coated boron nitride having a hard coated film excellent in adhesive strength as well as smoothness.

2. Description of the Related Art cBN (cubic boron nitride) has a hardness and thermal conductivity next to diamond and excellent characteristics such that reactivity with ferrous metals is lower as compared with diamond. Thus, a cutting tool using a cBN sintered compact containing this cBN has displaced grinding or working tools and cutting tools of cemented carbides or cements in working hard-to-cut ferrous materials from the standpoint of improving the working efficiency and reducing the installation cost.

The cBN sintered compact for a cutting tool is a sintered compact comprising binder cBN particles and a binder, which can generally be classified into the following two types:

(1) Sintered compact well-balanced in wear resistance as well as strength and mainly used for hardened steels, which comprises 30 to 80 volume % of cBN particles, the cBN particles being bonded through a binder predominantly consisting of Ti type ceramics such as TiN, TiC, TiCN, etc.

(2) Sintered compact excellent in thermal conductivity as well as strength and mainly used for cast irons, which comprises 80 to 90 volume % of cBN particles, the cBN particles being directly bonded and the balance of a binder predominantly consisting of an Al compound or Co compound.

cBN compacts for cutting tools have lately been watched with keen interest as a tool adaptable for the global environment problem, since consciousness for the global environment problem is more increasing, for example, as to reduction of industrial wastes such as grinding sludges and decrease of consumed electric power as a prevention from the global warming problem.

However, cBN particles have disadvantages that affinity for ferrous metals is larger than TiN, TiC, TiCN binders, in addition to having cleavage property, in spite of that the cBN particles have a higher hardness as represented by a Vickers hardness Hv of about 5,000 (the hardness Hv of the binder being at most about 2,500). Accordingly, further a service life lengthening is desired for the cBN compact tool because of finally expiring due to thermal abrasion and breakage of the tool edge due to progress of abrasion.

In particular of late, the expectations for the cBN compact tool have Similarly increased ever more from the standpoint of diversification of hardened steel parts and increasing functionality, and it has been desired to develop a tool capable of working a surface of a workpiece in a high grade and with a high speed and high efficiency.

For example, in order to further improve the wear resistance and fracture strength of a cBN sintered compact, a method has been proposed comprising coating the cBN sintered compact with a film of TiN, TiCN, TiAlN, etc.

However, a cBN sintered compact tool meets with a problem that an unexpected delamination of a coated film occurs often, resulting in dispersion of the service life because of being used under severe conditions.

For the purpose of improving the adhesive strength of a coated film, there has been proposed a tool, which is used for previously roughening a surface of substrate in a roughness of 0.5 to 12.5 $\mu$m and film making on the roughened surface, for example, as shown in JP-A-7-18415 or U.S. Pat. No. 5,709,907. In the case of carrying out cutting using these tools, the shape of the tool surface is transferred to a workpiece and accordingly, the dimensional precision and grade of the worked surface is worsened as compared with the prior art cBN sintered compacts. Since the cBN tool is often applied to uses requiring a working precision with $\mu$m order, in particular, practical cutting by these tools is difficult.

On the other hand, as a means for improving the adhesive strength of a coated film without surface-roughening a cBN substrate, there has been proposed a tool comprising a cBN sintered compact whose surface is coated with a hard coated film consisting of titanium nitride through a metallic Ti layer with a mean layer thickness of 0.05 to 0.3 $\mu$m, for example as shown in JP-A-1-96083 or JP-A-1-96084. According to these methods, however, a cutting edge is exposed to a high pressure and high temperature environment during cutting a relatively hard, hard-to-cut ferrous material and accordingly, there arises a problem that metallic titanium thus softens and the hard coated film is easily broken and delaminated.

In a TiAlN-coated cBN tool of JP-A-8-119774, there is disclosed such a technique that a TiN layer is coated as an intermediate layer between a cBN substrate and TiAlN-coated film to bond the TiAlN-coated film thereto with a high adhesive strength without surface roughening the cBN substrate, but according to this technique, further improvement of the adhesive strength between the cBN substrate and TiN film cannot be expected in principle and in the case of coating a cBN sintered compact with a small content of TiN or TiC, that is, high cBN content sintered compact, moreover, lowering of the adhesive strength of the hard coated film is unavoidable.

Accordingly, the inventors have made studies on the mechanism of breakage or delamination of the hard coated film in the coated cBN sintered compact tool for the purpose of developing a tool capable of providing a high grade worked surface maintained for a long time without delaminating the hard coated film in the coated cBN sintered compact tool even if the tool is subjected to cutting under severer conditions.

Consequently, the inventors have found that:

(I) a cBN sintered compact is bonded with a hard thin film such as TiN, TiCN or TiAlN film by diffusion or reaction between the substrate and the hard coated film, during which a stronger adhesion occurs with the binder part rather than with the hardly sinterable cBN particles to maintain the adhesive strength of the hard coated film and substrate and (II) When an excessive stress remains in the hard coated layer or when an impact is loaded on a hard coated film from outside, for example, during working a workpiece having an interrupted part, film delamination due to breakage in the interface between the hard coated film and cBN sintered compact or in the hard coated film takes place by such a stress.

SUMMARY OF THE INVENTION

It is an object of the present invention to provide an improved cutting tool based on a sintered compact comprising a high pressure phase type boron nitride such as cBN, wBN, etc., having a hard coated film excellent in adhesive strength as well as smoothness.

It is another object of the present invention to provide a surface-coated high pressure phase boron nitride sintered compact tool in which the adhesive strength of the hard coated film to the substrate is remarkably improved, in particular, noticing an improvement of an intermediate layer, whereby the problems of the prior art, as described above, can be solved.

These objects can be accomplished by a surface-coated boron nitride sintered compact tool, in which at least a part of the tool edge related with cutting is based on a substrate of a high pressure phase type boron nitride, and a surface-coated layer is allowed to be present on the surface thereof, the said surface-coated layer comprising an intermediate layer present in discontinuous manner to the interface of the said high pressure phase boron nitride sintered compact substrate and a hard coated layer formed further thereon, the said intermediate layer consisting of at least one element selected from the Group 4a, 5a and 6a of Periodic Table having a thickness of at most 1 $\mu$m, preferably at least 0.005 $\mu$m to at most 1 $\mu$m.

BRIEF DESCRIPTION OF THE DRAWINGS

The accompanying drawings are to illustrate the principle and merits of the present invention in detail.

FIGS. 3A and 3B are typical views of a film making apparatus by an arc ion plating method used for the production of a sintered compact according to the present invention, wherein FIG. 3A is a cross-sectional view and FIG. 3B is a plan view.

The inventors have thought that in a surface-coated boron nitride sintered compact, improvement of the adhesive strength of the cBN sintered compact without roughening the surface thereof can be effected by forming an intermediate layer with good reactivity with cBN particles as a predominant component of the cBN sintered compact, and the cBN sintered compact substrate can thus be coated with a hard coated layer with a high adhesive strength. Consequently, it is found as a result of our studies that when an intermediate layer is formed of a metallic or intermetallic compound containing at least one element selected from the Group 4a, 5a and 6a of the Periodic Table and has a specified thickness, the cBN sintered compact substrate can be coated with a hard coated layer with a high adhesive strength, and the hard coated layer is hardly delaminated even if subjected to cutting under severe conditions. The present invention is based on this finding.

The above described objects can favorably be achieved by each of the inventive embodiments summarized below:

(1) A surface-coated boron nitride sintered compact tool, in which at least a part of the tool edge related with cutting is based on a substrate of a high pressure phase type boron nitride, and a surface-coated layer is allowed to be present on the surface thereof, the surface-coated layer comprising an intermediate layer present in a discontinuous manner on the interface of the high pressure phase boron nitride sintered compact substrate and a hard coated layer formed further thereon, the intermediate layer consisting of at least one element selected from the Groups 4a, 5a and 6a of the Periodic Table and having a thickness of at most 1 $\mu$m, preferably at least 0.005 $\mu$m to at most 1 $\mu$m.

(2) A surface-coated boron nitride sintered compact tool, in which at least a part of the tool edge related with cutting is based on a substrate of a high pressure phase type boron nitride, and a surface-coated layer is allowed to be present on the surface thereof, the surface-coated layer comprising an intermediate layer present in a discontinuous manner on the interface of the high pressure phase boron nitride sintered compact substrate and a hard coated layer formed further thereon, the intermediate layer being present as dispersed particles consisting of at least one element selected from the Groups 4a, 5a and 6a of the Periodic Table, the proportion of these particles having a particle diameter of at least 0.1 to less than 0.5 $\mu$m being at least 1% to at most 20% by volume, preferably at least 1% to at most 18% by volume, based on the surface-coated layer, and the proportion of these particles having a particle diameter of at least 0.5 $\mu$m being at most 5% by volume, based on the surface-coated layer.

(3) The surface-coated boron nitride sintered compact tool as described in the foregoing (1) or (2), wherein the intermediate layer contains at least one element selected among Cr, Zr and V.

(4) The surface-coated boron nitride sintered compact tool as described in any one of the foregoing (1) to (3), wherein the hard coated layer contains at least one layer containing at least one element selected from the group consisting of Group 4a, 5a, 6a elements, Al, B, Si and Y and at least one element selected from the Group consisting of C, N and O and having a hardness of a Knoop Hardness Hk=at least 2,000 and a film thickness of at least 0.5 $\mu$m to at most 10 $\mu$m, preferably at least 1 $\mu$m to at most 5 $\mu$m.

(5) The surface-coated boron nitride sintered compact tool as described in any one of the foregoing (1) to (4), wherein the surface-coated layer is formed by an ion plating method, sputtering method or vacuum arc vapor deposition method.

(6) The surface-coated boron nitride sintered compact tool as described in any one of the foregoing (1) to (5), wherein the outermost surface layer of the surface-coated layer is a compound consisting of at least one element selected from the group consisting of Ti and Cr and at least one element selected from the group consisting of C, N and O.

(7) The surface-coated boron nitride sintered compact tool as described in any one of the foregoing (1) to (6), wherein the outermost surface layer of the surface-coated layer is a CrN layer.

(8) The surface-coated boron nitride sintered compact tool as described in any one of the foregoing (1) to (7), wherein at least a site related with cutting is provided with a surface-coated layer having a central line mean roughness Ra, defined by JIS B0601 (measured length 0.8 mm), of at most 0.2 $\mu$m.

(9) The surface-coated boron nitride sintered compact tool as described in any one of the foregoing (1) to (8), wherein at least a part of the tool edge related with cutting is based on a cubic boron nitride sintered compact comprising at least 30 volume % to at most 80 volume % of cBN and the balance of at least one binder selected from the group consisting of nitrides, borides, carbides of Group 4a, 5a and 6a elements of Periodic Table, and Al compounds and solid solutions thereof and unavoidable impurities.

(10) The surface-coated boron nitride sintered compact tool as described in any one of the foregoing (1) to (8), wherein at least a part of the tool edge related with cutting is based on a cubic boron nitride sintered compact comprising at least 80 volume % to at most 90 volume % of cBN and the balance of at least one binder selected from the group consisting of Co compounds and Al compounds, and solid solutions thereof and unavoidable impurities.

(11) The surface-coated boron nitride sintered compact tool as described in any one of the foregoing (1) to (10), wherein the cubic boron nitride has a mean grain diameter of at most 4 μm, preferably at least 0.5 μm to at most 3.5 μm.

As a component of the above described intermediate layer, there are preferably used metallic Cr, Ti, V, Zr and W. These metals are reactive with a high pressure phase type boron nitride such as cBN as a predominant component of the cBN sintered compact of the substrate and are reacted therewith to form nitrides and borides of the above described metals in the interface between the above described cBN substrate and intermediate layer, whereby to increase the adhesive strength thereof, and furthermore, the intermediate layer is reacted with a hard coated layer coated on the intermediate layer to readily form nitrides, carbides, carbonitrides and oxides of Cr, Ti, V, Zr and W, whereby to bond the cBN sintered compact as the substrate and the hard coated film.

When the intermediate layer is formed, elements for composing the intermediate layer are diffused into the inside of the sintered compact in the cubic boron nitride particles and binder part by kinetic energy incident upon the cBN sintered compact surface to form a gradient composition material continuously changed in composition. The cBN sintered compact surface containing elements for composing the thus formed intermediate layer further improves the adhesive strength with the intermediate layer.

In the interface between the intermediate layer and hard coated layer, there is also formed a gradient composition part of the elements forming the intermediate layer to improve the adhesive strength of the interface. Moreover, when the elements forming the intermediate layer in a very small amount are added to a layer of a compound such as TiAlN for forming the hard coated layer, the wear resistance and oxidation resistance of the hard coated layer can further be improved as to properties as a cutting tool.

When there remains excessive stress in the hard coated layer even if improving the adhesive strength at the interface of the cBN substrate, film delamination sometimes takes place due to breakage in the film by the residual stress. However, the film delamination due to breakage in the hard coated layer can be suppressed by discontinuously arranging an intermediate layer more excellent in ductility than the hard coated layer to moderate the concentration of stress. As shown in FIG. 2, in particular, it is preferable from the standpoint of stress moderation that the above described discontinuously formed intermediate layer is composed of particles having a particle diameter of at least 0.1 μm to at most 0.5 μm.

That is, the granular intermediate layer is surrounded by the foregoing hard coated layer, whereby a skeleton structure of a more compact and finer hard coated layer can be formed, and this is particularly effective for such uses that the cutting edge is loaded with large impacts, for example, in continuous cutting of high hardness, hard-to-cut ferrous materials with largely fluctuated cutting depths or with a number of initial cuttings, in interrupted cutting of hard-to-cut ferrous materials, etc.

The present invention is characterized in that the intermediate layer is formed as a discontinuous layer or a granular discontinuous layer, as described above, whereby the adhesive strength between the cBN sintered compact and hard coated layer is more increased and the concentration of stress is moderated, thus obtaining advantages of suppressing delamination of the hard coated layer and cBN sintered compact substrate.

Figure 1A:
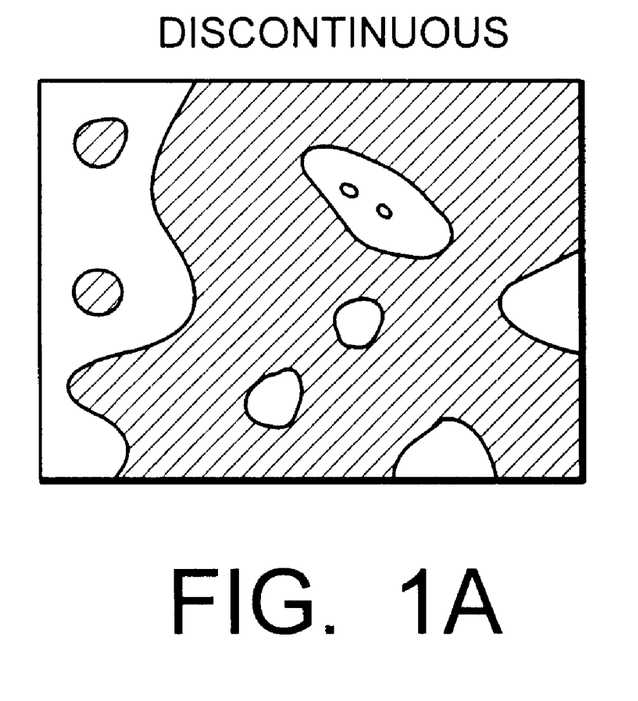
FIG. 1A is a plan view and FIG. 1B is a sectional view of a coated state of an intermediate layer in a discontinuous manner according to the present invention on a cBN substrate surface.
Figure 1B:
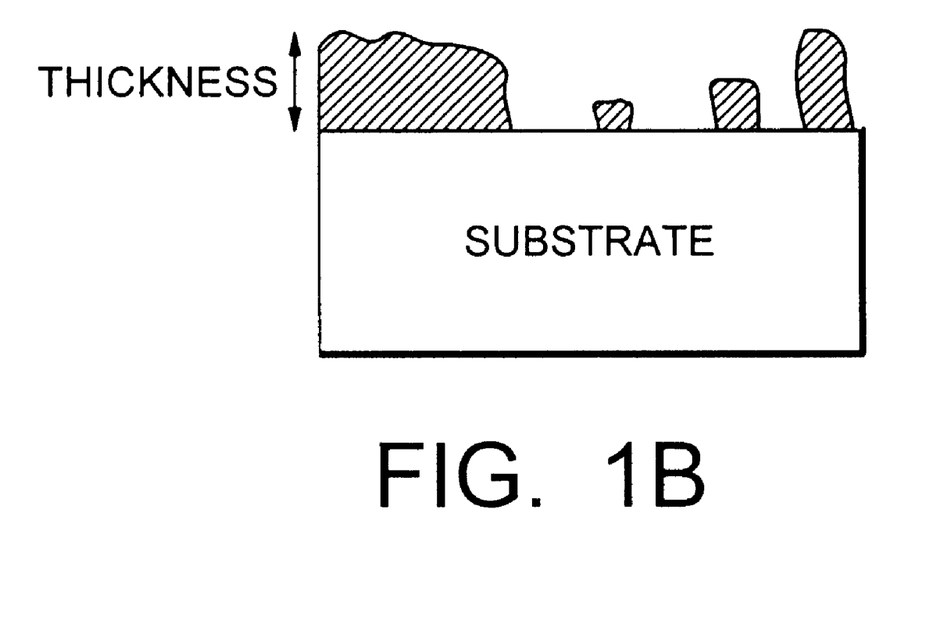

The discontinuous intermediate layer has a thickness of preferably at least 0.005 μm to at most 1 μm to obtain a high adhesive strength (discontinuous intermediate layer, Cf. FIGS. 1A and 1B). The ground for limiting the thickness is as follows. When the thickness of the intermediate layer is less than 0.005 μm, a diffusion layer or reaction layer cannot be formed to obtain a sufficient adhesive strength, or when the thickness of the intermediate layer exceeds 1 μm, a layer consisting of a low hardness, metallic component that remains undiffused and unreacted is too thick to prevent the hard coated layer from delamination during cutting at a high temperature and high pressure.

Figure 2A:
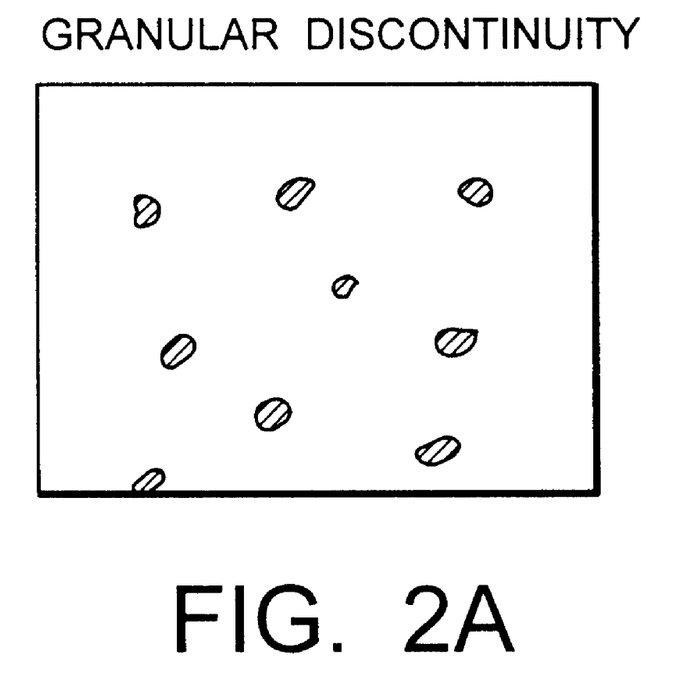
FIG. 2A is a plan view and FIG. 2B is a cross-sectional view of a coated state of an intermediate layer as a granular and discontinuous phase according to the present invention on a cBN substrate surface.
Figure 2B:
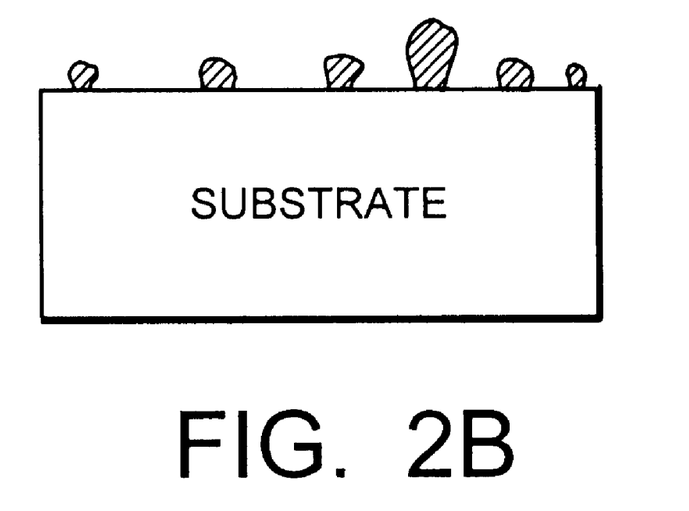

The discontinuous intermediate layer is composed of dispersed particles (granular discontinuous intermediate layer, Cf. FIGS. 2A and 2B) When the proportion of grains or particles having a grain diameter of at least 0.1 μm to less than 0.5 μm exceeds 20% by volume or the proportion of grains or particles having a grain diameter of at least 0.5 μm exceeds 5% by volume, the physical properties of the surface coated layer are dominant, as described above, and the cutting property of the surface-coated boron nitride sintered compact cutting tool is substantially diminished or decreased.

When the proportion of the particles having a particle diameter of at least 0.1 μm to less than 0.5 μm is less than 1% by volume, there is no achieved effect of the above described stress moderating.

As a component of the above described intermediate layer, there are preferably used metallic Cr, Zr and V.

Cr is capable of providing an intermediate layer having a smoother surface roughness as compared with metallic Ti, V, Zr, Hf and W. This is because Cr has a higher melting point, i.e. 1890° C., while Ti has a melting point of 1675° C., and it is difficult for Cr to form coarser particles during coating the intermediate layer, so it is capable of forming a uniform, dense intermediate layer with a smooth surface roughness, because of having a high vapor pressure similar to that of low melting point Al even though Cr is a high melting point metal. Consequently, in the case of using metallic Cr for an intermediate layer, the surface roughness of the surface-coated boron nitride sintered compact cutting tool is more smooth and, in addition, a workpiece can be worked in a higher grade than in the case of using the foregoing cutting tools having intermediate layers of metallic Ti, V, Zr, Hf and W.

Zr forms a boride through reaction with high pressure phase boron nitride during film making of the intermediate layer and Zr boride is very stable for ferrous metals, while Ti boride has relatively high affinity for ferrous metals. Thus, in the case of using metallic Zr for an intermediate layer, the metallic intermediate layer is less damaged during cutting and is subjected to less lowering of the adhesive strength during abrasion of the edge than in the case of using metallic Ti for an intermediate layer.

V and V compounds are capable of decreasing the cutting resistance because of forming an oxide having lubricating action.

Formation of the intermediate layer can be carried out in known manner, for example, by PVD methods such as vacuum vapor deposition method, sputtering method, vacuum arc vapor deposition method, ion plating method or by various CVD methods. Above all, the ion plating method, sputtering vapor deposition method and vacuum arc vapor deposition method are particularly preferable, since these methods provide high adhesive strengths with the substrates through high ionization efficiency of raw materials, ion implantation effect on the substrate, etc. In the case of forming an intermediate layer, control of the thickness in at least 0.005 $\mu$m to less than 1 $\mu$m is generally carried out by suitably controlling the variety of gases, gas pressure, vacuum degree, arc current, bias voltage and film making time depending on the variety of a target for the operation of an ordinary film making apparatus.

In order to form a discontinuous or granular intermediate layer, a bias voltage applied to a substrate to be treated is predominantly controlled in a range from −300 V to −1000 V, since if the bias voltage is less negative than −300V, a continuous film is formed and the object of the present invention cannot be achieved and if the bias voltage negatively exceeds −1000 V, the sputtering effect is too large to form an intermediate layer.

As described above, when using only a cBN sintered compact, there occur sometimes cases where a wear resistance is lacking or where cleaved particles or falling particles of cBN during cutting are caught in a tool edge to form striated scratches on the flank wear part of the tool, which are transferred to the worked surface, thus deteriorating the surface roughness of a worked surface.

Thus, it is preferable that the bard coated layer comprises a layer of at least one compound formed of at least one element selected from the group consisting of Group 4a, 5a and 6a elements of Periodic Table, Al, B, Si and Y, and at least one element selected from the group consisting of C, N and O. When a cBN sintered compact is coated with the above described hard coated layer with a good adhesive strength to prevent the cBN particles from contacting with a hard-to-cut ferrous material, there are given merits, for example, improvement of the wear resistance and breakage resistance of the tool and working of a surface of a workpiece with a higher grade. In particular, when Y is dissolved to form a solid solution, the hardness and oxidation resistance of the film can be improved.

In the present invention, the hard coated layer can suitably be formed of a plurality of layers, the outermost surface layer of which is preferably TiN or CrN layer. The reason therefor is that the cBN sintered compact exhibits a color of black, while TiN and CrN respectively have clear colors of gold and silver, which serve to make easy to distinguish a service life of expired tool and non-used tool, when using the present surface-coated sintered compact tool through a mass-production system, thus fulfilling management of the tools. It is particularly preferable that the outermost surface layer of the hard coated layer is a CrN layer, since adhesion during cutting can be suppressed to maintain a good finished surface for a long time by coating the outermost surface with the CrN layer having a very small friction coefficient.

The CrN film of the prior art has a lower hardness, i.e. Hk=1,700 than that of TiN film, i.e. Hk=2,000 in spite of having the above described excellent adhesion resistance. Accordingly, in the case of coating a cBN substrate with a monolayer or using a cemented carbide substrate, a large stress concentration takes place on the film surface, so that the CrN film or cemented carbide substrate is subject to plastic deformation and cannot follow in the deformation, thus resulting in cracking or delamination of the CrN film.

In the present invention, a cBN sintered compact or TiAlN (Hk=at least 2,500) more excellent in hardness than CrN is used as a ground, by which, even if a large stress concentration takes place, the quantity of deformation is suppressed to prevent the CrN film from breakage and to remarkably improve the durability.

The film thickness of the hard coated layer is preferably adjusted to at least 0.5 $\mu$m to at most 10 $\mu$m, in particular, at least 1 $\mu$m to at most 5 $\mu$m, since if the film thickness is less than 0.5 $\mu$m, the hard coated layer is subject to abrasion in too short time to maintain the effect of the hard coated layer, while if exceeding 10 $\mu$m, the adhesive strength with the substrate is decreased by the residual stress in the hard coated layer.

Formation of the surface-coated layer is generally carried out in known manner, for example, by PVD methods such as vacuum vapor deposition method, sputtering vapor deposition method, vacuum arc vapor deposition method, ion plating method or by various CVD methods. Above all, the ion plating method, sputtering vapor deposition method and vacuum arc vapor deposition method are particularly preferable, since these methods provide high adhesive strengths with the substrates through high ionization efficiency of raw materials, ion implantation effect on the substrate, etc.

In the case of a thin film formation by the PVD method, e.g. ion plating method, ionized raw materials are implanted into the substrate by a bias voltage applied between a vaporization source and a substrate to be coated, to clean the interface or form a kind of mixing layer in the interface, thus resulting in a higher adhesive strength. In one embodiment of the present invention, the intermediate layer and hard coated layer are formed in a continuous manner by a same apparatus, whereby the above described effects are achieved during formation of both the layers.

The cBN sintered compact as the substrate has the preferred compositions (1) and (2) exemplified below:

(1) A cBN sintered compact comprising at least 30 volume % to at most 80 volume % of cBN and the balance of at least one binder selected from the group consisting of nitrides, borides and carbides of Group 4a, 5a and 6a elements of Periodic Table, and Al compounds and solid solutions thereof, and unavoidable impurities.

This cBN sintered compact exhibits an improved wear resistance as well as strength, because of consisting of predominantly cBN particles and the above described binder with a low affinity for iron, strongly bonded with each other.

In this cBN sintered compact, the cBN content is preferably at least 30% to 80% by volume, since if the cBN content is less than 30 volume %, the hardness of the cBN sintered compact is lowered, for example, the hardness is lacking for cutting a high hardness workpiece such as hardened steel, while if the cBN content is more than 80 volume %, adhesion of cBN particles with each other through the binder is difficult and the hardness of the cBN sintered compact is decreased.

(2) A cBN sintered compact comprising at least 80 volume % to at most 90 volume % of cBN particles bonded with each other and the balance of at least one binder selected from the group predominantly consisting of Al compounds and Co compounds.

In this cBN sintered compact, the content of cBN particles can be increased by carrying out liquid phase sintering of Al- or Co-containing metal or intermetallic compound having a catalytic function as raw materials and bonding cBN particles with each other. That is, because of the high cBN content, the cBN particles form each other a strong skeleton structure which is excellent in breakage resistance and makes possible cutting under severer conditions.

In this cBN sintered compact, the cBN content is preferably at least 80% to 90% by volume, since if the cBN content is less than 80 volume %, the formation of the skeleton structure by bonding of cBN grains with each other is difficult, while if the cBN content is more than 90 volume %, non-sintered parts occur in the cBN sintered compact due to lacking of the above described binder having a catalytic action and the hardness of the cBN sintered compact is thus decreased.

When the mean particle diameter of cBN particles in the cBN sintered compact as a substrate is at most 4 μm, the cutting property is markedly improved.

This is because when the cBN particles have a particle diameter of at most 4 μm, the surface area of the cBN particles is increased to improve the adhesive strength of the cBN particles and the hard coated layer. A preferred range of the mean particle diameter is 0.5 to 3.5 μm.

The present invention will now be illustrated in detail without limiting the same.

EXAMPLES

Example 1

(1) Preparation of Sample

A binder powder consisting of 40 weight % of TiN and 10 weight % of Al, and 50 weight % of cBN powder with a particle diameter of 2 μm were mixed, charged in a cemented carbide vessel and sintered at a pressure of 5 GPa and a temperature of 1400° C. for 60 minutes to obtain a cBN sintered compact for continuously cutting hardened steels. The resulting cBN sintered compact was worked in a cutting insert with a shape of SNGA 120408 according to ISO Standard.

Figure 3A:
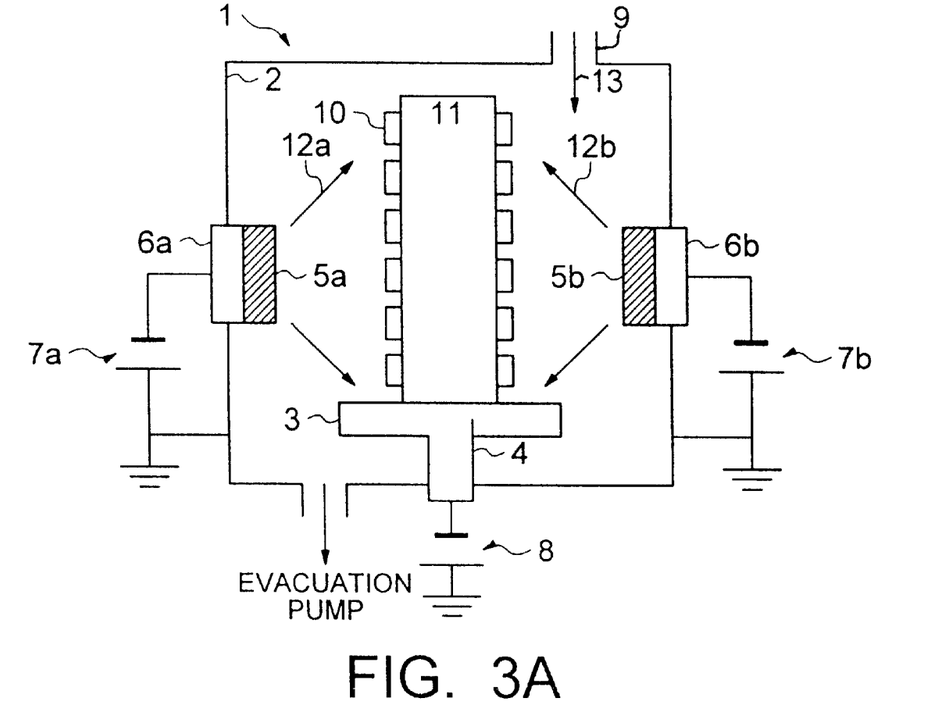
Figure 3B:
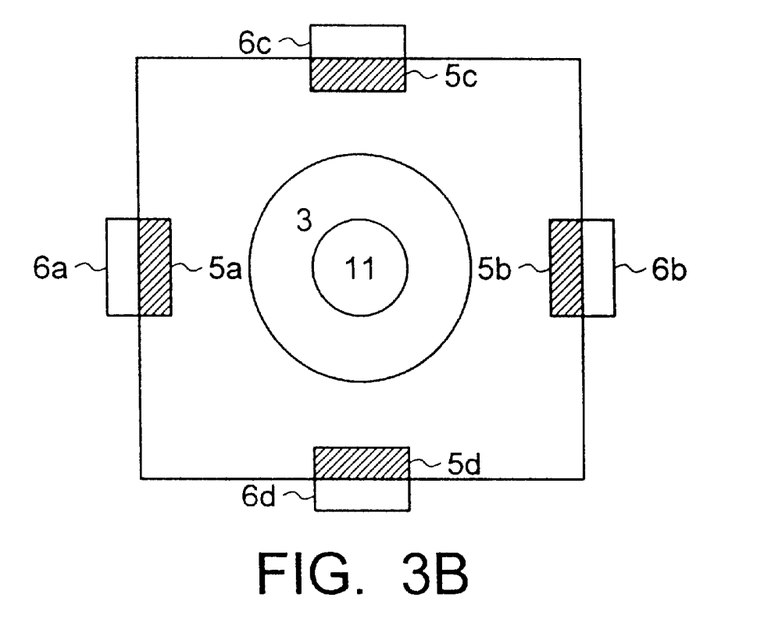

This insert was coated with a hard coated layer by the following method:

FIGS. 3A and 3B are typical drawings of a film forming apparatus used in the present invention, which is according to a known arc ion plating method. Referring to FIG. 3A, a film forming apparatus 1 comprises a chamber 2, main table 3, support rod 4, arc type vaporization sources 5a and 5b, cathodes 6a and 6b, direct current sources 7a, 7b and 8 as a variable power source, and gas inlet 9 for feeding a gas.

The chamber 2 is connected with a vacuum pump to change the pressure in the chamber 2. This chamber is provided with the main table 3, support rod 4, gas inlet 9 and arc type vaporization sources 5a and 5b.

The support rod 4 provided in the chamber 2 supports the main table 3. A revolving shaft is provided in the support rod 4 and this revolving shaft revolves the main table 3. The main table 3 is provided with a jig 11 for holding substrates 10. The support rod 4, main table 3 and jig 11 are electrically connected with a negative pole of the direct current source 8. A positive pole of the direct current source 8 is grounded.

The side wall of the chamber 2 is provided with the arc type vaporization source 5b and cathode 6b in such a manner as facing the arc type vaporization source 5a and cathode 6a connected with the arc type vaporization source 5a.

The arc type vaporization source 5a and cathode 6a are electrically connected with a negative pole of the direct current source 7a. The positive pole of the direct current source 7a is grounded and electrically connected with the chamber 2. The positive pole of the direct current source 7b is grounded and electrically connected with the chamber 2. (As shown in FIG. 3B, a pair of vaporization sources 5c and 5d are arranged in the direction perpendicular to the paper surface.)

The arc type vaporization sources 5a and 5b are partly melted by arc discharge between the arc type vaporization sources 5a and 5b and chamber 2, and the arc type vaporization material is vaporized in the directions shown by arrows 12a and 12b. A voltage is applied between the cathodes 6a and 6b and chamber 2. The arc type vaporization source 5a is composed of (Ti 0.5, Al 0.5). The arc type vaporization source 5b is composed of a metal or intermetallic compound consisting of at least one element selected from the Group 4a, 5a and 6a elements of the Periodic Table, such as Ti, Cr, Zr and V. The compound of (Ti 0.5, Al 0.5) means a compound having the specified ratio of number of atoms, i.e. Ti and Al of 0.5:0.5.

Into the gas inlet 9 for supplying gases are introduced various gases from the direction shown by an arrow 13. Examples of the gas include argon, nitrogen, hydrogen, oxygen gases, or hydrocarbon gases such as methane, acetylene, benzene, etc.

Using the apparatus shown by FIG. 3A, the chamber 2 was evacuated by the vacuum pump while revolving the main table 3, and the substrate 10 was heated at a temperature of 450° C. by a heater (not shown), the evacuation being carried out until the pressure of the chamber 2 was $1.5 \times 10^{-5}$ Pa. Then, argon gas was introduced from the gas inlet 9 to maintain the pressure inside the chamber at 3 to 5.0 Pa, and while the voltage of the direct current source 8 was gradually raised, the surface of the substrate 10 was cleaned for 20 minutes at a voltage of −1000 V, after which the argon gas was exhausted.

Thereafter, argon gas was introduced from the gas inlet 9 in such a manner that the pressure inside the chamber 2 was set to 0.5 to 10.0 Pa. An arc current of 50 to 200 A was supplied from the direct current source 7b to generate metallic ions from the arc type vaporization source 5b. The bias voltage of the direct current source 8 was adjusted to −300 V to −600 V and formation of various intermediate layers was carried out on the surface of the substrate 10, during which this state was maintained until reaching a predetermined thickness (10 nm). Depending on the variety of the target, a discontinuous intermediate layer (FIG. 1) was formed by controlling the above described gas pressure, arc current, bias voltage and film forming time, after which the direct current sources 7b and 8 were cut off and the argon gas was exhausted.

After the foregoing intermediate layer was formed, nitrogen gas was fed from the gas inlet 9 so that the pressure inside the chamber 2 was set to 5 Pa, an arc current of 100 A was supplied from the direct current source 7a to vaporize the compound of (Ti 0.5, Al 0.5), of which the arc type vaporization source 5a was formed, and a voltage of −150 V was applied to the direct current source 8, thus forming a hard coated layer of (Ti, Al)N with a thickness of about 3 μm on the surface of the substrate 10.

Subsequently, the direct current source 7a was cut off and an arc current of 100 A was supplied to the direct current source 7b to generate Cr ions from the arc type vaporization source 5b and to form a CrN film of about 0.5 μm thick on the outermost surface of the substrate 10.

Further, inserts of the present invention (Sample Nos. 1 to 4) were prepared in an analogous manner as described above, except changing the arc type vaporization sources 5a and 5b and changing the film forming time.

For comparison, there were prepared Sample No. 13, in which a hard coated layer was formed without forming an intermediate layer, Sample No. 14, in which the material of an intermediate layer was not in the scope of the present invention, Sample Nos. 5 and 10, in each of which the film thickness of the intermediate layer was not within the scope of the present invention, Sample No. 20, in which the film thickness of a hard coated layer was not within the scope of the present invention, Sample No. 21, in which the surface-coated layer of the present invention was coated on a cemented carbide substrate (P 30) and Sample No. 22, in which a cBN sintered compact was not coated with the surface-coated layer.

The hardness (Hk) of these hard coated layers as to the above described samples was measured by lapping a sample by a lapping paper of #10000, and indenting a Knoop indenter against the sample under conditions of a load of 25 g and time of 10 seconds, followed by measuring the indented size.

(2) Cutting Test

Using these cutting inserts, peripheral cutting of one of hardened steels, i.e. round bar of SUJ 2 (HRC 63) was carried out. The cutting was carried out under conditions of cutting speed 150 m/min, cutting depth 0.2 mm, feed 0.1 mm/rev. and dry process for 25 minutes and the flank wear width and delaminated state of the hard coated film were estimated.

Details of the samples and estimation results in the case of effecting the cutting tests are shown in Table 1.

TABLE 1

| Sample No. | Intermediate Layer Material (mean film thickness) | Hard Coated Layer First Layer (mean film thickness) | Hard Coated Layer Surface Layer (mean film thickness) | Cutting Estimation Flank Wear Width After 5 Min. Cutting [mm] | Estimation | Cutting Time Till Film Delamination [min] | Estimation | General Estimation |
|---|---|---|---|---|---|---|---|---|
| 1 | Ti (0.005 μm) | TiAlN (3.1 μm) | CrN (0.2 μm) | 0.055 | ○ | — | ○ | ○ |
| 2 | Ti (0.05 μm) | TiAlN (3.0 μm) | CrN (0.2 μm) | 0.050 | ○ | — | ○ | ○ |
| 3 | Ti (0.5 μm) | TiAlN (3.1 μm) | CrN (0.3 μm) | 0.055 | ○ | — | ○ | ○ |
| 4 | Ti (1.0 μm) | TiAlN (3.1 μm) | CrN (0.2 μm) | 0.065 | ○ | — | ○ | ○ |
| 5 | Ti (1.5 μm) | TiAlN (3.1 μm) | CrN (0.2 μm) | 0.100 | Δ | 5.5 | X | X |
| 6 | Cr (0.005 μm) | TiAlN (3.0 μm) | CrN (0.2 μm) | 0.055 | ○ | — | ○ | ○ |
| 7 | Cr (0.05 μm) | TiAlN (3.0 μm) | CrN (0.3 μm) | 0.050 | ○ | — | ○ | ○ |
| 8 | Cr (0.5 μm) | TiAlN (3.1 μm) | CrN (0.2 μm) | 0.050 | ○ | — | ○ | ○ |
| 9 | Cr (1.0 μm) | TiAlN (3.0 μm) | CrN (0.2 μm) | 0.070 | ○ | — | ○ | ○ |
| 10 | Cr (1.5 μm) | TiAlN (3.1 μm) | CrN (0.2 μm) | 0.100 | Δ | 8 | X | X |
| 11 | V (0.5 μm) | TiAlN (3.1 μm) | CrN (0.2 μm) | 0.050 | ○ | — | ○ | ○ |
| 12 | Zr (0.5 μm) | TiAlN (3.0 μm) | CrN (0.2 μm) | 0.045 | ○ | — | ○ | ○ |
| 13 | no | TiAlN (3.0 μm) | CrN (0.2 μm) | 0.055 | ○ | 16.5 | Δ | Δ |
| 14 | Cu (0.5 μm) | TiAlN (3.0 μm) | CrN (0.2 μm) | not measured due to film delamination | — | 0.5 | X | X |
| 15 | Nb (0.5 μm) | TiAlN (3.0 μm) | CrN (0.2 μm) | 0.105 | Δ | 11 | Δ | Δ |
| 16 | Cr (0.5 μm) | CrN (3.0 μm) | CrN (0.2 μm) | 0.155 | X | — | ○ | X |
| 17 | Cr (0.5 μm) | TiAlN (0.2 μm) | CrN (0.2 μm) | 0.125 | Δ | — | ○ | Δ |
| 18 | Cr (0.5 μm) | TiAlN (0.3 μm) | CrN (0.2 μm) | 0.065 | ○ | — | ○ | ○ |
| 19 | Cr (0.5 μm) | TiAlN (9.0 μm) | CrN (0.5 μm) | 0.055 | ○ | 24 | ○ | ○ |
| 20 | Cr (0.5 μm) | TiAlN (10.0 μm) | CrN (0.5 μm) | 0.060 | ○ | 21 | Δ | Δ |
| 21 | Cr (0.5 μm) | TiAlN (3.1 μm) | CrN (0.5 μm) | film delamination and breakage due to plastic deformation of cemented carbide substrate | X | 0.1 | X | X |
| 22 | no | no | no | 0.130 | Δ | — | — | Δ |

[Note]
TiAlN: Hk = 2,700, CrN: Hk = 1,700, cBN Sintered Compact: Hk = 3,000; Estimation Results: ○, Δ, X (good, medium, bad)

From these results, it will be understood that in the case of Sample Nos. 1 to 4, 6 to 9, 11, 12 and 16 to 20 of the present invention, whose intermediate layers are composed of at least one element selected from Group 4a, 5a and 6a elements of Periodic Table, film delamination is harder to occur in the Cutting Test, as compared with Sample No. 13 free from an intermediate layer and Sample No. 14 whose intermediate layer is composed of other elements than Group 4a, 5a and 6a elements of Periodic Table. Furthermore, abrasion is found to be largely decreased as compared with Sample No. 22, i.e. a cBN sintered compact for cutting hardened steels according to the prior art.

Sample Nos. 5 and 10 each having a larger thickness of the intermediate layer and Sample No. 20 having a relatively large thickness of the hard coated layer, as compared with the present invention, encounter film delamination at the initial period of cutting, thus resulting in a shorter service life.

Sample No. 21 comprising a cemented carbide substrate coated with the surface-coated layer of the present invention cannot be used in the working conditions of the present Examples, because of meeting with plastic deformation from the initial period of cutting and causing breakage of both the substrate and surface-coated layer.

Example 2

(1) Preparation of Sample

Using balls and a pot made of a cemented carbide, a binder powder consisting of 15 weight % of Co and 5 weight % of Al, and 80 weight % of cBN powder with a particle diameter of 3 $\mu$m were mixed, charged in a cemented carbide vessel and sintered at a pressure of 5 GPa and a temperature of 1400° C. for 60 minutes to obtain a cBN sintered compact for intermittent cutting of hardened steels. The resulting cBN sintered compact was worked in a cutting insert with a shape of SNGA 120408 according to ISO Standard.

This insert was coated with various surface-coated layers in an analogous manner to Example 1 by the use of the arc type vaporization source 5a formed of (Ti 0.5, Al 0.5) containing 3 weight % of Y, and then subjected to measurement of the hardness (Sample Nos. 23 to 31).

Formation of a discontinuous and granular intermediate layer (FIG. 2) was carried out by controlling, in the step of forming the intermediate layer during the step of film making, the bias voltage of the direct current source 8 in −600 to −1000 V, the pressure inside the chamber in 0.5 to 10.0 Pa and depending on the variety of targets, controlling the gas pressure, arc voltage, bias voltage and film making time.

For examining a proportion of the granular discontinuous intermediate layer of granules with a size of at least 0.1 $\mu$m to smaller than 0.5 $\mu$m, and a proportion of the granular discontinuous intermediate layer of granules with a size of at least 0.5 $\mu$m, present in the surface coated layer, the foregoing coated samples (Sample Nos. 32 to 45) were subjected to analysis, as to a surface obtained by cutting in the direction perpendicular to the rake face by FIB (Focussed Ion Beam Working Device), by means of FE-SEM (Field Emission type Scanning Electron Microscope).

(2) Cutting Test

Using these cutting inserts, peripheral cutting of a hardened steel, i.e. a workpiece (HRC 58) in the form of a round bar of SCM 415 having two U-type grooves, was carried out. The cutting was carried out under conditions of a cutting speed of 200 m/min, a cutting depth of 0.2 mm, a feed rate of 0.1 mm/rev. and a dry process for 15 minutes, and the flank wear width and delaminated state of the hard coated film were then estimated.

Details of the samples and estimation results in the case of effecting the cutting tests are shown in Table 2.

TABLE 2

| | Intermediate Layer | | Hard Coated Layer | | Cutting Estimation | | | | |
|---|---|---|---|---|---|---|---|---|---|
| Sample No. | Material (layer thickness) | Shape (proportion of particles of at least 0.1 $\mu$m and less than 0.5 $\mu$m/ proportion of dispersed particles of at least 0.5 $\mu$m) | First Layer (mean film thickness) | Surface Layer (mean film thickness) | Crater Depth After 3 Min. Cutting [mm] | Estimation | Cutting Time Till Film Delamination [min] | Estimation | General Estimation |
| 23 | Ti (0.04 $\mu$m) | continuous | TiAlYN (3.0 $\mu$m) | TiN (0.2 $\mu$m) | 0.032 | ○ | 13 | Δ | Δ |
| 24 | Ti (0.5 $\mu$m) | discontinuous | TiAlYN (3.1 $\mu$m) | TiN (0.2 $\mu$m) | 0.027 | ○ | — | ○ | ○ |
| 25 | Cr (0.5 $\mu$m) | discontinuous | TiAlYN (3.0 $\mu$m) | TiN (0.2 $\mu$m) | 0.025 | ○ | — | ○ | ○ |
| 26 | Cr (0.9 $\mu$m) | discontinuous | TiAlYN (3.0 $\mu$m) | TiN (0.2 $\mu$m) | 0.029 | ○ | — | ○ | ○ |
| 27 | Cr (1.1 $\mu$m) | discontinuous | TiAlYN (3.0 $\mu$m) | TiN (0.2 $\mu$m) | 0.037 | ○ | 7 | Δ | ○ |
| 28 | V (0.5 $\mu$m) | discontinuous | TiAlYN (3.1 $\mu$m) | TiN (0.3 $\mu$m) | 0.034 | ○ | — | ○ | ○ |
| 29 | Zr (0.5 $\mu$m) | discontinuous | TiAlYN (3.0 $\mu$m) | TiN (0.2 $\mu$m) | 0.028 | ○ | — | ○ | ○ |
| 30 | Nb (0.5 $\mu$m) | discontinuous | TiAlYN (3.0 $\mu$m) | TiN (0.2 $\mu$m) | 0.049 | Δ | 7 | Δ | Δ |
| 31 | Cu (0.5 $\mu$m) | discontinuous | TiAlYN (3.0 $\mu$m) | TiN (0.2 $\mu$m) | not measured due to film delamination | — | 0.1 | X | X |
| 32 | Ti | granular discontinuity (8%/3%) | TiAlYN (3.1 $\mu$m) | TiN (0.2 $\mu$m) | 0.031 | ○ | — | ○ | ○ |
| 33 | Cr | granular discontinuity (8%/3%) | TiAlYN (3.1 $\mu$m) | TiN (0.2 $\mu$m) | 0.025 | ○ | — | ○ | ○ |

TABLE 2-continued

| | Intermediate Layer | | Hard Coated Layer | | Cutting Estimation | | | | |
|---|---|---|---|---|---|---|---|---|---|
| | | Shape (proportion of particles of at least 0.1 μm and less than 0.5 μm/ proportion of dispersed particles of at least 0.5 μm) | | | | | Cutting | | |
| Sample No. | Material (layer thickness) | | First Layer (mean film thickness) | Surface Layer (mean film thickness) | Crater Depth After 3 Min. Cutting [mm] | Estimation | Time Till Film Delamination [min] | Estimation | General Estimation |
| 34 | V | granular discontinuity (8%/3%) | TiAlYN (3.0 μm) | TiN (0.2 μm) | 0.035 | ○ | — | ○ | ○ |
| 35 | Zr | granular discontinuity (8%/3%) | TiAlYN (2.9 μm) | TiN (0.3 μm) | 0.027 | ○ | — | ○ | ○ |
| 36 | Cu | granular discontinuity (8%/3%) | TiAlYN (3.0 μm) | TiN (0.2 μm) | not measured due to film delamination | — | 0.2 | X | X |
| 37 | Cr | granular discontinuity (0.5%/3%) | TiAlYN (3.1 μm) | TiN (0.2 μm) | 0.032 | ○ | 18 | Δ | Δ |
| 38 | Cr | granular discontinuity (1.0%/3%) | TiAlYN (3.0 μm) | TiN (0.2 μm) | 0.028 | ○ | — | ○ | ○ |
| 39 | Cr | granular discontinuity (18%/3%) | TiAlYN (3.0 μm) | TiN (0.2 μm) | 0.022 | ○ | — | ○ | ○ |
| 40 | Cr | granular discontinuity (22%/3%) | TiAlYN (2.9 μm) | TiN (0.2 μm) | 0.045 | Δ | 15 | Δ | Δ |
| 41 | Cr | granular discontinuity (8%/6%) | TiAlYN (3.0 μm) | TiN (0.2 μm) | 0.050 | X | 14 | Δ | X |
| 42 | no | no | TiAlYN (3.0 μm) | TiN (0.2 μm) | 0.032 | ○ | 2 | X | X |
| 43 | Cr | granular discontinuity (8%/3%) | TiAlYN (9.0 μm) | CrN (0.5 μm) | 0.029 | ○ | — | ○ | ○ |
| 44 | Cr | granular discontinuity (8%/3%) | TiAlYN (10.0 μm) | CrN (0.5 μm) | not measured due to film delamination | — | 7 | Δ | Δ |
| 45 | Cr | granular discontinuity (8%/3%) | TiAlYN (3.0 μm) | TiN (0.2 μm) | film delamination and breakage due to plastic deformation of cemented carbide substrate | — | 7 | Δ | Δ |
| 46 | no | no | no | no | 0.050 | X | — | — | X |

[Note]
TiAlYN: Hk = 2,900, CrN: Hk = 1,700, cBN Sintered Compact: Hk = 3,500; Estimation Results: ○, Δ, X (good, medium, bad)

From these results, it will be understood that in the case of Sample Nos. 24 to 26, 28, 29, 37 to 39 and 43, whose intermediate layers are composed of at least one element selected from Groups 4a, 5a and 6a of the Periodic Table, film delamination is harder to occur in the Cutting Test and a longer service life during cutting can be obtained, as compared with Sample No. 42 having no intermediate layer, end Sample Nos. 31 and 36, whose intermediate layer is Composed of other elements than elements of Groups 4a, 5a and 6a of the Periodic Table. Furthermore, a longer service life can be given, as compared with Sample No. 46, i.e. a cBN sintered compact of the prior art.

Sample No. 27 having a larger thickness of the intermediate layer as compared with the present invention, Sample No. 40 having a larger proportion of particles with a size of at least 0.1 μm to less than 0.5 μm and Sample No. 41 having a larger proportion of dispersed particles with a size of at least 0.5 μm in the intermediate layer of the surface coated layer, reversely encounter sometimes film delamination, thus resulting in a shorter service life.

Sample No. 45 comprising a cemented carbide substrate coated with the surface-coated layer of the present invention cannot be used in the working conditions of the present Examples, because of meeting with plastic deformation from the initial period of cutting and causing breakage of both the substrate and surface-coated layer.

Example 3

(1) Preparation of Sample

Using balls and a pot made of cemented carbide, a binder powder consisting of 50 weight % of TiN and 5 weight % of Al, and 45 weight % of cBN powder with a particle diameter of 1 μm were mixed, charged in a cemented carbide vessel and sintered at a pressure of 5 GPa and a temperature of 1400° C. for 40 minutes to obtain a cBN sintered compact for high precision cutting of hardened steels. The resulting cBN sintered compact was worked in a cutting insert with a shape of SNGA 120408 according to ISO Standard.

This insert was coated with various surface-coated layers in an analogous manner to Example 2 by the use of the arc type vaporization source 5a formed of (Ti 0.7, Al 0.3) and then subjected to measurement of the hardness.

The central line mean roughness Ra [defined by JIS B0601 (measurement length 0.8 mm)] of the surface-coated layer of a part related with cutting during the same time was estimated. The surface roughness of the surface coated layer was measured on various roughness samples prepared while varying the vacuum degree during film making within a range of $1 \times 10^{-6}$ to $1 \times 10^{-6}$ Torr.

When the presence of the granular discontinuous intermediate layer in the surface coated layer was examined in an analogous manner to Example 2, the proportion of the particles with a size of at least 0.1 μm to less than 0.5 μm of the granular discontinuous intermediate layer was 8% and the proportion of particles with a size of at least 0.5 μm of the granular intermediate layer was 3%.

(2) Cutting Test

Using these cutting inserts, peripheral cutting of one of hardened steels, i.e. workpiece (HRC 60) of round bar of SCM 415 was then carried out. The cutting was carried out under conditions of cutting speed 200 m/min, cutting depth 0.1 mm, feed 0.08 mm/rev. and dry process for 40 minutes and the ten-point mean surface roughness Rz (defined by JIS B0601) of the workpiece and the delaminated state of the hard coated film were estimated.

Details of the samples and estimation results in the case of effecting the cutting tests are shown in Table 3.

Example 4

(1) Preparation of Sample

Using balls and a pot made of a cemented carbide, a binder powder consisting of 40 weight % of TiN and 15 weight % of Al, and 45 weight % of cBN powder with a grain diameter of 3 μm were mixed, charged in a cemented carbide vessel and sintered at a pressure of 5 GPa and a temperature of 1400° C. for 50 minutes to obtain a cBN sintered compact for wide use cutting of hardened steels. The resulting cBN sintered compact was worked in a cutting insert with a shape of SNGA 120412 according to ISO Standard.

This insert was coated with various surface-coated layers in an analogous manner to Example 1 by the use of the arc

TABLE 3

| | | Hard Coated Layer | | | Cutting Estimation | | | | |
|---|---|---|---|---|---|---|---|---|---|
| Sample No. | Intermediate Layer Material | First Layer (mean film thickness) | Surface Layer (mean film thickness) | Sample Ra [μm] (vacuum degree [$10^{-3}$ Torr]) | Workpiece Rz [μm] | Estimation | Cutting Time Till Film Delamination [min] | Estimation | General Estimation |
| 47 | Cr | TiAlN (3.0 μm) | CrN (0.2 μm) | 0.14 (0.5) | 2.12 | ○ | not delaminated | ○ | ○ |
| 48 | Cr | TiAlN (3.0 μm) | CrN (0.2 μm) | 0.18 (1) | 2.37 | ○ | not delaminated | ○ | ○ |
| 49 | Cr | TiAlN (3.0 μm) | CrN (0.2 μm) | 0.20 (5) | 2.66 | ○ | not delaminated | ○ | ○ |
| 50 | Ti | TiAlN (3.0 μm) | CrN (0.2 μm) | 0.22 (0.5) | 2.88 | ○ | not delaminated | ○ | ○ |
| 51 | Ti | TiAlN (3.0 μm) | CrN (0.2 μm) | 0.31 (1) | 3.22 | Δ | not delaminated | ○ | Δ |
| 52 | Ti | TiAlN (3.0 μm) | CrN (0.2 μm) | 0.38 (5) | 3.68 | X | not delaminated | ○ | ○ |
| 53 | Cu | TiAlN (3.0 μm) | CrN (0.5 μm) | 0.60 (0.5) | 4.81 | X | 1.5 | X | X |
| 54 | no | no | no | ✗0.20 | 4.00 | X | — | — | X |

[Note]
TiAlN: Hk = 2,500, CrN: Hk = 1,700, cBN Sintered Compact: Hk = 2,800;
✗·Surface Roughness of cBN Sintered Compact
Estimation Results: ○, Δ, X (good, medium, bad)

From these results, it will be understood that in the case of Sample Nos. 47 to 52, whose intermediate layers are composed of at least one element selected from Group 4a, 5a and 6a elements of Periodic Table, high precision working of a sample with a smaller surface roughness, that is, working in a smoother surface and providing a smaller surface roughness Rz in the cutting test is rendered possible, and film delamination is harder to occur to lengthen the service life, as compared with Sample No. 53, whose intermediate layer is composed of other elements than Group 4a, 5a and 6a elements of Periodic Table. Furthermore, it is apparent that a higher precision worked surface is obtained even in comparison with the prior art cBN sintered compact for high precision working of hardened steels.

Thus, it will be understood that when the intermediate layer is Cr layer, in particular, in Sample Nos. 47 to 52 whose intermediate layers are composed of at least one element selected from Group 4a, 5a and 6a of Periodic Table, the surface roughness Ra of the sample is smaller and the surface roughness Rz of the workpiece is smaller, thus resulting in a longer service life, than the articles of the present invention in which the intermediate layer having the same surface roughness consists of Ti.

type vaporization source 5a formed of (Ti 0.6, Al 0.4) and then subjected to measurement of the hardness.

When the presence state of the granular discontinuous intermediate layer present in the surface coated layer was examined in an analogous manner to Example 2, the proportion of particles with a size of at least 0.1 μm to less than 0.5 μm of the granular discontinuous intermediate layer was 8% and the proportion of grains with a size of at least 0.5 μm of the granular intermediate layer was 3%.

(2) Cutting Test

Using these cutting inserts, peripheral cutting of one of hardened steels, i.e. workpiece (HRC 15) of round bar of S45C was carried out. The cutting was carried out under conditions of cutting speed 600 m/min, cutting depth 0.5 mm, feed 0.3 mm/rev. and dry process for 30 minutes and the quantity of the flank wear width and the delaminated state of the hard coated film were estimated.

Details of the samples and estimation results in the case of effecting the cutting tests are shown in Table 4.

TABLE 4

| Sample No. | Intermediate Layer Material | Hard Coated Layer | | Cutting Estimation | | | | |
|---|---|---|---|---|---|---|---|---|
| | | First Layer (mean film thickness) | Surface Layer (mean film thickness) | Flank Wear Width After 5 Min. Cutting [mm] | Estimation | Cutting Time Till Film Delamination [min] | Estimation | General Estimation |
| 55 | Ti | TiAlN (2.9 μm) | CrN (0.2 μm) | 0.105 (less adhesion) | Δ | — | ○ | Δ |
| 56 | Cr | TiAlN (2.9 μm) | CrN (0.2 μm) | 0.080 (less adhesion) | ○ | — | ○ | ○ |
| 57 | V | TiAlN (2.9 μm) | CrN (0.2 μm) | 0.070 (no adhesion) | ○ | — | ○ | Δ |
| 58 | V | TiAlN (3.0 μm) | HfN (0.2 μm) | 0.070 (no adhesion) | ○ | — | ○ | Δ |
| 59 | V | TiAlN (3.1 μm) | VN (0.2 μm) | 0.075 (no adhesion) | ○ | — | ○ | Δ |
| 60 | Zr | TiAlN (2.9 μm) | CrN (0.2 μm) | 0.100 (less adhesion) | Δ | — | ○ | ○ |
| 61 | no | TiAlN (3.0 μm) | CrN (0.2 μm) | 0.235 (more adhesion) | Δ | 24 | Δ | Δ |
| 62 | Cu | TiAlN (3.0 μm) | CrN (0.2 μm) | not measured due to film delamination | — | 0.1 | X | X |
| 63 | V | TiAlN (2.9 μm) | CrN (0.2 μm) | film delamination and breakage due to plastic deformation of cemented carbide substrate | — | 0.5 | X | X |
| 64 | no | no | no | 0.255 (more adhesion) | X | — | — | X |

[Note]
TiAlN: Hk = 2,800, CrN: Hk = 1,700, VN: Hk = 1,600, HfN: Hk = 2,200, cBN Sintered Compact: Hk = 3,000; Estimation Results: ○, Δ, X (good, medium, bad)

From these results, it will be understood that in the case of Sample Nos. 55 to 60, whose intermediate layers are composed of at least one element selected from Group 4a, 5a and 6a elements of Periodic Table, film delamination is harder to occur in the cutting test to lengthen the service life during cutting, as compared with Sample No. 61, which is free from an intermediate layer, and Sample No. 62, whose intermediate layer is composed of other elements than Group 4a, 5a and 6a elements of Periodic Table. Furthermore, abrasion is suppressed to lengthen the service life as compared with Sample No. 64 as the cBN sintered compact of the prior art.

In Sample Nos. 57 to 60 of the present invention, using V as an intermediate layer, there is no adhesion during cutting with good abrasive state.

Sample No. 63 comprising a cemented carbide substrate coated with the surface-coated layer of the present invention cannot be used in the working conditions of the present Examples, because of meeting with plastic deformation from the relatively initial period of cutting and causing breakage of both the substrate and surface-coated layer.

Example 5

(1) Preparation of Sample

A sample was prepared in an analogous manner to Example 1, except that in a production of a high pressure phase boron nitride (cBN or wBN) sintered compact, the mixing ratio of a binder and high pressure phase boron nitride powders or the grain sizes of the powders were changed in suitable manner. The coated layers were all composed of a discontinuous Cr intermediate layer (0.4 μm thick) with a hard coated layer as a first layer, i.e. TiAlN (3.0 μm) and an outermost surface layer, CrN (0.3 μm).

(2) Cutting Test

Using these cutting inserts, peripheral cutting of workpiece (HRC 59) of round bar of SKD 11 as die steel, having six V-type grooves, was carried out. The cutting was carried out under conditions of cutting speed 120 m/min, cutting depth 0.2 mm, feed 0.1 mm/rev. and dry process and the time was measured until the surface coated layer was delaminated or the cutting insert including the cBN substrate was broken.

Details of the samples and estimation results in the case of effecting the cutting tests are shown in Table 5.

TABLE 5

| Sample No. | Substrate cBN Sintered Compact | | | Cutting Estimation | | | |
|---|---|---|---|---|---|---|---|
| | High Pressure Phase Boron Nitride Content [vol %] | High Pressure Phase Boron Nitride Mean Grain Diameter [μm] | Binder Composition Ratio [wt %] | Cutting Time Till Film Delamination [min] | Cutting Time Till Breakage [min] | Remarks | Estimation |
| 65 | cBN:20 | 2.5 | 75:TiN 25:Al | — | 1 | breakage of substrate to expire life before film delamination | X |

TABLE 5-continued

| | Substrate cBN Sintered Compact | | | Cutting Estimation | | | |
|---|---|---|---|---|---|---|---|
| Sample No. | High Pressure Phase Boron Nitride Content [vol %] | High Pressure Phase Boron Nitride Mean Grain Diameter [μm] | Binder Composition Ratio [wt %] | Cutting Time Till Film Delamination [min] | Cutting Time Till Breakage [min] | Remarks | Estimation |
| 66 | cBN:45 | 2.5 | 75:TiN 25:Al | 8 | 13 | — | ○ |
| 67 | cBN:55 | 2.5 | 75:TiN 25:Al | 11 | 14 | — | ○ |
| 68 | cBN:45, wBN:10 | 1.0 | 75:TiN 25:Al | 10 | 13 | — | ○ |
| 69 | wBN:55 | 0.2 | 75:TiN 25:Al | 10 | 13 | — | ○ |
| 70 | cBN:55 | 2.5 | 60:TiC 40:TiAl$_3$ | 11 | 13 | — | ○ |
| 71 | cBN:70 | 2.5 | 75:TiN 25:Al | 11 | 15 | — | ○ |
| 72 | cBN:90 | 2.5 | 75:TiN 25:Al | — | 5 | breakage of substrate to expire life before film delamination | X |
| 73 | cBN:55 | 5.0 | 75:TiN 25:Al | 7 | 11 | — | Δ |
| 74 | cBN:60 | 2.5 | 45:Co, 30:Al 13:WC, 12:TiN | — | 3 | breakage of substrate to expire life before film delamination | X |
| 75 | cBN:85 | 2.5 | 45:Co, 30:Al 13:WC, 12:TiN | 8 | 14 | — | ○ |
| 76 | cBN:95 | 2.5 | 45:Co, 30:Al 13:WC, 12:TiN | — | 3 | breakage of substrate to expire life before film delamination | X |
| 77 | cBN:85 | 5.0 | 45:Co, 30:Al 13:WC, 12:TiN | 5 | 10 | — | ○ |

[Note]
Estimation Results: ○, Δ, X (good, medium, bad)

From these results, it will be understood that in the case of Sample Nos. 65 to 72, in which the binder of the cBN sintered compact substrate comprises at least one member selected from the group consisting of nitrides, borides, carbides of Group 4a, 5a and 6a elements of Periodic Table and solid solutions thereof and Al compounds, and unavoidable impurities, Sample Nos. 65 and 72, whose cBN contents are outside the scope of the present invention are inferior in strength of the cBN sintered compact substrate and tend to break at the initial period of cutting to expire the life. Further, it is found that in Sample No. 73, having a larger mean particle diameter, film delamination tends to occur.

From these results, it will moreover be understood that in the case of Sample Nos. 74 to 76, in which the binder of the cBN sintered compact substrate comprises at least one member selected from the group consisting of Co compounds, Al compounds and solid solutions thereof, and unavoidable impurities, Sample Nos. 74 and 76, whose cBN contents are outside the scope of the present invention, are inferior in strength of the cBN sintered compact substrate and tends to break at the initial period of cutting to expire the life. In Sample No. 77, having a larger mean particle diameter, moreover, film delamination tends to occur.

Example 6

(1) Preparation of Sample

A sample of a cutting insert described below was prepared in an analogous manner to Example 4.

Using balls and a pot made of a cemented carbide, a binder powder consisting of 40 weight % of TiN and 15 weight % of Al, and 45 weight % of cBN powder with a particle diameter of 3 μm were mixed, charged in a cemented carbide vessel and sintered at a pressure of 5 GPa and a temperature of 1400° C. for 50 minutes to obtain a cBN sintered compact for wide use cutting of hardened steels. The resulting cBN sintered compact was worked in a cutting insert with a shape of SNGA 120412 according to ISO Standard.

This insert was coated with the surface-coated layer having the same structure as that of Sample No. 56 of Example 4 in an analogous manner to Example 1 by the use of the arc type vaporization source 5a formed of (Ti 0.6, Al 0.4) and then subjected to measurement of the hardness.

(2) Analysis of Element Distribution

Then, a thin film piece was prepared by slicing the above described cutting insert in the direction perpendicular to the surface coated layer, and the resulting thin piece was used as a sample for a transmission electron microscope by ionic thinning or milling method. The sample was observed by the transmission electron microscope, and, selecting several sites in the film thickness direction from the interface of the substrate side with respect to the surface coated layer, a composition of composed elements at each of the analysis sites was sought using an energy dispersion type X-ray micro-analysis device (EDX). For quantifying, calibration was carried out by a working curve obtained from a standard sample. The present analysis was carried out on two sites, that is, a part corresponding to an upper part of the cBN crystal particles of the substrate and another part corresponding to an upper part of the binder.

The results are shown in Table 6.

TABLE 6

| Upper Part of cBN Crystal Particles | | | | | | Upper Part of Binder | | | | | |
| --- | --- | --- | --- | --- | --- | --- | --- | --- | --- | --- | --- |
| Distance From Interface (nm) | N | O | Al | Ti | Cr | Distance From Interface (nm) | N | O | Al | Ti | Cr |
| 24 | 10.6 | 2.8 | 22.2 | 61.7 | 2.8 | 24 | 8.1 | 2.4 | 10.7 | 77.4 | 1.2 |
| 96 | 9.6 | 2.7 | 25.8 | 41.2 | 0.8 | 112 | 9.2 | 2.7 | 26.4 | 60.9 | 0.7 |
| 176 | 9.8 | 2.3 | 27.9 | 59.8 | 0.3 | 196 | 9.5 | 2.6 | 27.3 | 60 | 0.6 |
| 256 | 10.4 | 2.2 | 27.6 | 59.7 | 0.2 | 272 | 9.4 | 2.7 | 25.9 | 61.5 | 0.5 |
| 504 | 11.6 | 2.4 | 27.2 | 58.8 | 0.1 | 516 | 9.7 | 2.3 | 24 | 62 | 0.2 |
| | | | | | | 864 | 9.5 | 1.9 | 26.4 | 62.4 | 0 |

Figure 4:
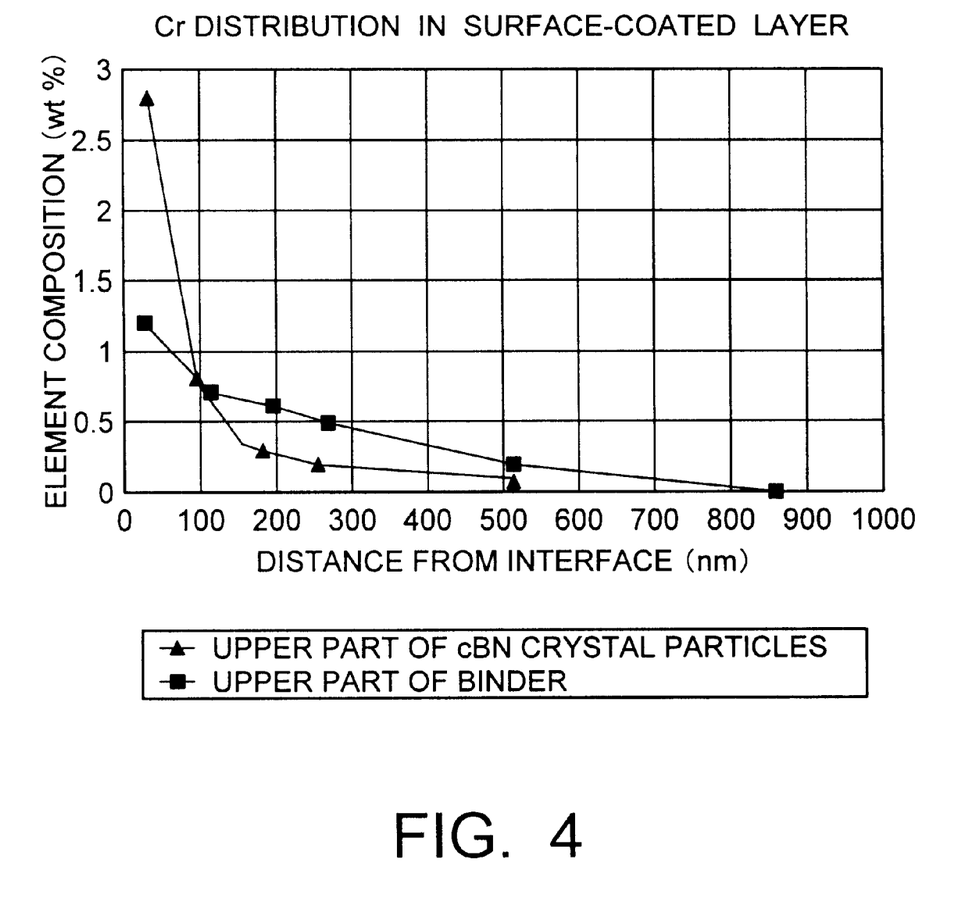

FIG. 4 shows the results of Example 6 in which Cr element distribution is plotted for the distances (nm) from the interface. It is apparent from FIG. 4 that the Cr element distribution is decreased toward the growth direction of the surface coated layer from the interface part, thus forming a gradient composition material, in any case of the upper part of the cBN crystal particles and the upper part of the binder.

Advantages of the Invention

The surface-coated cubic boron nitride sintered compact tool of the present invention can favorably be compared with the prior art one with respect to improvement of the adhesive strength of the hard coated layer to the cBN sintered compact substrate, improvement of the wear resistance and breakage resistance of the tool through suppressing contact of cBN particles and hard-to-cut ferrous materials and other excellent effects of improving a worked surface, whereby the service life of the tool is markedly improved.

What is claimed is:

1. A surface-coated boron nitride sintered compact tool, in which at least a part of the tool edge related with cutting is based on a substrate of a high pressure phase type boron nitride, and a surface-coated layer is allowed to be present on the surface thereof, the said surface-coated layer comprising an intermediate layer present in discontinuous manner to the interface of the said high pressure phase boron nitride sintered compact substrate and a hard coated layer formed further thereon, the said intermediate layer consisting of at least one element selected from the Group 4a, 5a and 6a of Periodic Table and having a thickness of at most 1 μm.

2. The surface-coated boron nitride sintered compact tool as claimed in claim 1, wherein the intermediate layer contains at least one of elements of Cr, Zr and V.

3. The surface-coated boron nitride sintered compact tool as claimed in claim 1, wherein the hard coated layer contains at least one layer containing at least one element selected from the group consisting of Group 4a, 5a, 6a elements, Al, B, Si and Y and at least one element selected from the group consisting of C, N and O and having a hardness of a Knoop Hardness Hk=at least 2,000 and a film thickness of at least 0.5 μm to at most 10 μm.

4. The surface-coated boron nitride sintered compact tool as claimed in claim 1, wherein the surface-coated layer is formed by an ion plating method, sputtering method or vacuum arc vapor deposition method.

5. The surface-coated boron nitride sintered compact tool as claimed in claim 1, wherein the outermost surface layer of the surface-coated layer consists of a compound consisting of at least one element selected from the group Consisting of Ti and Cr and at least one element selected from the group consisting of C, N and O.

6. The surface-coated boron nitride sintered compact tool as claimed in claim 1, wherein the outermost surface layer of the surface-coated layer is a CrN layer.

7. The surface-coated boron nitride sintered compact tool as claimed in claim 1, wherein at least a site related with cutting is provided with a surface-coated layer having a central line mean roughness Ra, defined by JIS B0601 (measured length 0.8 mm), of at most 0.2 μm.

8. The surface-coated boron nitride sintered compact tool as claimed in claim 1, wherein at least a part of the tool edge related with cutting is based on a cubic boron nitride sintered compact comprising at least 30 volume % to at most 80 volume % of cubic boron nitride and the balance of at least one binder selected from the group consisting of nitrides, borides, carbides of Group 4a, 5a and 6a elements of Periodic Table, and Al compounds and solid solutions thereof and unavoidable impurities.

9. The surface-coated boron nitride sintered compact tool as claimed in claim 1, wherein at least a part of the tool edge related with cutting is based on a cubic boron nitride sintered compact comprising at least 80 volume % to at most 90 volume % of cubic boron nitride and the balance of at least one binder selected from the group consisting of Co compounds and Al compounds, and solid solutions thereof and unavoidable impurities.

10. The surface-coated boron nitride sintered compact tool as claimed in claim 1, wherein the cubic boron nitride has a mean particle diameter of at most 4 μm.

11. A surface-coated boron nitride sintered compact tool, in which at least a part of the tool edge related with cutting is based on a substrate of a high pressure phase type boron nitride, and a surface-coated layer is allowed to be present on the surface thereof, the said surface-coated layer comprising an intermediate layer present in discontinuous manner to the interface of the said high pressure phase boron nitride sintered compact substrate and a hard coated layer formed further thereon, the said intermediate layer being present as dispersed particles consisting of at least one element selected from the Group 4a, 5a and 6a of Periodic Table, the proportion of particles of at least 0.1 μm to less than 0.5 μm being at least 1% to at most 20% by volume based on the surface-coated layer, and the proportion of particles of at least 0.5 μm by volume being at most 5% by volume, based on the surface-coated layer.

12. The surface-coated boron nitride sintered compact tool as claimed in claim 2, wherein the intermediate layer contains at least one of elements of Cr, Zr and V.

13. The surface-coated boron nitride sintered compact tool as claimed in claim 2, wherein the hard coated layer contains at least one layer containing at least one element selected from the group consisting of Group 4a, 5a, 6a elements, Al, B, Si and Y and at least one element selected from the group consisting of C, N and O and having a hardness of a Knoop Hardness Hk=at least 2,000 and a film thickness of at least 0.5 μm to at most 10 μm.

14. The surface-coated boron nitride sintered compact tool as claimed in claim 2, wherein the surface-coated layer is formed by an ion plating method, sputtering method or vacuum arc vapor deposition method.

15. The surface-coated boron nitride sintered compact tool as claimed in claim 2, wherein the outermost surface layer of the surface-coated layer consists of a compound consisting of at least one element selected from the group consisting of Ti and Cr and at least one element selected from the group consisting of C, N and O.

16. The surface-coated boron nitride sintered compact tool as claimed in claim 2, wherein the outermost surface layer of the surface-coated layer is a CrN layer.

17. The surface-coated boron nitride sintered compact tool as claimed in claim 2, wherein at least a site related with cutting is provided with a surface-coated layer having a central line mean roughness Ra, defined by JIS B0601 (measured length 0.8 mm), of at most 0.2 $\mu$m.

18. The surface-coated boron nitride sintered compact tool as claimed in claim 2, wherein at least a part of the tool edge related with cutting is based on a cubic boron nitride sintered compact comprising at least 30 volume % to at most 80 volume % of cubic boron nitride and the balance of at least one binder selected from the group consisting of nitrides, borides, carbides of Group 4a, 5a and 6a elements of Periodic Table, and Al compounds and solid solutions thereof and unavoidable impurities.

19. The surface-coated boron nitride sintered compact tool as claimed in claim 2, wherein at least a part of the tool edge related with cutting is based on a cubic boron nitride sintered compact comprising at least 80 volume % to at most 90 volume % of cubic boron nitride and the balance of at least one binder selected from the group consisting of Co compounds and Al compounds, and solid solutions thereof and unavoidable impurities.

20. The surface-coated boron nitride sintered compact tool as claimed in claim 11, wherein the cubic boron nitride has a mean particle diameter of at most 4 $\mu$m.

21. A cutting tool component having a cutting edge, and comprising:
a substrate that comprises a sintered compact comprising a high pressure phase boron nitride; and
a surface coat layer provided on said sintered compact, wherein said surface coat layer comprises:
a discontinuous intermediate layer that discontinuously covers portions of an interface of said sintered compact, and that consists of at least one element selected from the Groups 4a, 5a and 6a of the Periodic Table; and
a hard coating layer provided on said intermediate layer;
wherein said intermediate layer further has at least one of the following features:
said intermediate layer has a thickness of at most 1 $\mu$m, and/or
said intermediate layer consists of dispersed discrete particles consisting of said at least one element, including first particles having a particle diameter of at least 0.1 $\mu$m and less than 0.5 $\mu$m making up at least 1 vol. % and at most 20 vol. % of said surface coat layer, and second particles having a particle diameter of at least 0.5 $\mu$m making up at most 5 vol. % of said surface coat layer.

22. The cutting tool component according to claim 21, wherein said intermediate layer has said thickness of at most 1 $\mu$m.

23. The cutting tool component according to claim 22, wherein said thickness is at least 0.5 $\mu$m.

24. The cutting tool component according to claim 21, wherein said intermediate layer consists of said dispersed discrete particles.

25. The cutting tool component according to claim 21, wherein said at least one element comprises at least one of Cr, Zr and V.

26. The cutting tool component according to claim 21, wherein said hard coating layer includes at least one sublayer comprising at least one element selected from the group consisting of the Group 4a, 5a and 6a elements of the Periodic Table, Al, B, Si and Y, and at least one element selected from the group consisting of C, N and O, and having a Knoop hardness Hk of at least 2000 and a thickness of at least 0.5 $\mu$m and at most 10 $\mu$m.

27. The cutting tool component according to claim 21, wherein said surface coat layer further comprises an outermost surface layer that is provided on said hard coating layer and that forms an outermost surface of said tool component, wherein said outermost surface layer consists of a compound consisting of at least one first element selected from the group consisting of Ti and Cr and at least one second element selected from the group consisting of C, N and O.

28. The cutting tool component according to claim 27, wherein said outermost surface layer consists of CrN.

29. The cutting tool component according to claim 21, wherein a surface of said tool component at said cutting edge has a central line mean roughness Ra of at most 0.2 $\mu$m as defined by JIS B0601 for a measured length of 0.8 mm.

30. The cutting tool component according to claim 21, wherein said sintered compact comprises at least 30 vol. % and at most 80 vol. % of cubic boron nitride and a remainder of at least one binder selected from the group consisting of nitrides, borides and carbides of the Group 4a, 5a and 6a elements of the Periodic Table, and Al compounds and solid solutions thereof, as well as unavoidable impurities.

31. The cutting tool component according to claim 21, wherein said sintered compact comprises at least 80 vol. % and at most 90 vol. % of cubic boron nitride, and a remainder of at least one binder selected from the group consisting of Co compounds and Al compounds, and solid solutions thereof, as well as unavoidable impurities.

32. The cutting tool component according to claim 21, wherein said sintered compact consists of cubic boron nitride particles having a mean particle diameter of at most 4 $\mu$m.

* * * * *

UNITED STATES PATENT AND TRADEMARK OFFICE
CERTIFICATE OF CORRECTION

PATENT NO.    : 6,620,491 B2
DATED         : September 16, 2003
INVENTOR(S)   : Kukino et al.

It is certified that error appears in the above-identified patent and that said Letters Patent is hereby corrected as shown below:

Title page,
Item [56], References Cited, U.S. PATENT DOCUMENTS, insert in appropriate order:
-- 5,976,716    11/1999      Inspektor
   6,090,476    07/2000      Thysell et al. --.
FOREIGN PATENT DOCUMENTS, insert -- JP      10-245287      09/1998 --
After last cited FOREIGN PATENT DOCUMENT, insert:
-- OTHER PUBLICATIONS
   U. S. Patent Application 09/943,840, filed on
   August 27, 2001, Kukino et al., entitled: A Tool of a
   Surface-Coated Boron Nitride Sintered Compact; pages
   1 to 37 and 3 sheets of drawings. --.

Column 1,
Line 63, after "have", replace "Similarly" by -- similarly --.

Column 3,
Following line 44, insert the following paragraph:
        -- Fig. 4 is a graph showing a Cr distribution in a surface-coated layer. --;
Above line 45, insert -- DETAILED DESCRIPTION OF THE INVENTION --.

Column 7,
Line 38, after "the", replace "bard" by -- hard --.

Signed and Sealed this

Twentieth Day of January, 2004

JON W. DUDAS
*Acting Director of the United States Patent and Trademark Office*